United States Patent
Hikita et al.

(10) Patent No.: US 8,264,002 B2
(45) Date of Patent: *Sep. 11, 2012

(54) FIELD-EFFECT TRANSISTOR

(75) Inventors: Masahiro Hikita, Hyogo (JP); Tetsuzo Ueda, Osaka (JP); Manabu Yanagihara, Osaka (JP); Yasuhiro Uemoto, Shiga (JP); Tsuyoshi Tanaka, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/880,704

(22) Filed: Sep. 13, 2010

(65) Prior Publication Data
US 2010/0327293 A1   Dec. 30, 2010

Related U.S. Application Data

(63) Continuation of application No. 11/433,734, filed on May 15, 2006, now Pat. No. 7,816,707.

(30) Foreign Application Priority Data

Jun. 6, 2005   (JP) .................. 2005-165143

(51) Int. Cl.
*H01L 29/66* (2006.01)
*H01L 21/02* (2006.01)
*H01L 29/78* (2006.01)

(52) U.S. Cl. . 257/192; 257/388; 257/412; 257/E29.134; 257/E29.158

(58) Field of Classification Search .......... 257/76, 257/192, 388, 412, E29.134, E29.158
See application file for complete search history.

(56) References Cited

U.S. PATENT DOCUMENTS

| | | | |
|---|---|---|---|
| 6,156,581 | A | 12/2000 | Vaudo et al. |
| 6,281,528 | B1 | 8/2001 | Wada |
| 6,548,333 | B2 | 4/2003 | Smith |
| 6,690,042 | B2 | 2/2004 | Khan et al. |
| 6,878,593 | B2 | 4/2005 | Khan et al. |
| 7,038,252 | B2 | 5/2006 | Saito et al. |
| 7,053,425 | B2 | 5/2006 | Sandvik et al. |
| 7,485,901 | B2 | 2/2009 | Schaff et al. |
| 7,576,373 | B1 | 8/2009 | Hikita et al. |

(Continued)

FOREIGN PATENT DOCUMENTS

| | | |
|---|---|---|
| JP | 11-261053 | 9/1999 |
| JP | 2003-133332 | 5/2003 |
| JP | 2004-273486 | 9/2004 |

(Continued)

OTHER PUBLICATIONS

J.K. Abrokwah, et al., "High-Performance Self-Aligned p$^=$/n GaAs Epitaxial JFET's Incorporating AlGaAs Etch-Stop Layer," IEEE Transactions on Electron Devices, Jun. 1990, pp. 1529-1531, vol. 37, No. 6, IEEE.

(Continued)

*Primary Examiner* — Teresa M Arroyo
(74) *Attorney, Agent, or Firm* — McDermott Will & Emery LLP

(57) ABSTRACT

An AlN buffer layer, an undoped GaN layer, an undoped AlGaN layer, a p-type GaN layer and a heavily doped p-type GaN layer are formed in this order. A gate electrode forms an Ohmic contact with the heavily doped p-type GaN layer. A source electrode and a drain electrode are provided on the undoped AlGaN layer. A pn junction is formed in a gate region by a two dimensional electron gas generated at an interface between the undoped AlGaN layer and the undoped GaN layer and the p-type GaN layer, so that a gate voltage can be increased.

3 Claims, 11 Drawing Sheets

U.S. PATENT DOCUMENTS

| | | |
|---|---|---|
| 2003/0098462 A1 | 5/2003 | Yoshida |
| 2003/0121468 A1 | 7/2003 | Boone et al. |
| 2003/0209762 A1 | 11/2003 | Nishii et al. |
| 2005/0167775 A1 | 8/2005 | Nagy et al. |
| 2005/0189559 A1 | 9/2005 | Saito et al. |
| 2005/0189959 A1 | 9/2005 | Cohen et al. |
| 2006/0060871 A1 | 3/2006 | Beach |
| 2007/0164314 A1 | 7/2007 | Beach et al. |
| 2007/0176215 A1 | 8/2007 | Yanagihara et al. |
| 2007/0278521 A1 | 12/2007 | Ishida et al. |
| 2009/0146182 A1 | 6/2009 | Hikita et al. |

FOREIGN PATENT DOCUMENTS

| | | |
|---|---|---|
| JP | 2004-273486 A | 9/2004 |
| JP | 2005-086102 | 3/2005 |
| JP | 2005-244072 A | 9/2005 |

OTHER PUBLICATIONS

L. Zhang, et al., "Epitaxially-Grown GaN Junction Filed Effect Transistors," IEEE Transactions on Electron Devices, Mar. 2000, vol. 47, No. 3, pp. 507-511, IEEE.

M. A. Khan et al., "Microwave Operation of GaN/AlGaN-Doped Channel Heterostructure Field Effect Transistors," IEEE Electron Device Letters, Jul. 1996, vol. 17, No. 7, pp. 325-327.

FIELD-EFFECT TRANSISTOR

RELATED APPLICATIONS

This application is a Continuation of U.S. patent application Ser. No. 11/433,734, filed on May 15, 2006, now U.S. Pat. No. 7,816,707 claiming priority of Japanese Patent Application No. 2005-165143, filed on Jun. 6, 2005, the entire contents of each of which are hereby incorporated by reference.

BACKGROUND OF THE INVENTION

1. Field of the Invention

The present invention relates to a field-effect transistor using nitride semiconductor, which is applicable to a power transistor for use in a power supply circuit of a consumer-electronics product such as a TV set and a method for fabricating the field-effect transistor.

2. Description of the Prior Art

Nitride semiconductor is wide gap semiconductor. For example, GaN (gallium nitride) and AlN (aluminum nitride) as examples of nitride semiconductor exhibit band gaps of 3.4 eV and 6.2 eV, respectively, at ambient temperature. An advantage of nitride semiconductor is that it has a larger insulation breakdown electric field and a greater electron saturation drift speed than those of compound semiconductor such as GaAs (gallium arsenide) or Si semiconductor. Nitride semiconductor has another advantage. That is, with nitride semiconductor, in a hetero structure of AlGaN/GaN formed on a substrate with a (0001) plane, electric charges are generated at a hetero interface due to spontaneous polarization and piezoelectric polarization and a sheet carrier concentration of $1 \times 10^{13}$ cm$^{-2}$ or more can be obtained even in an undoped state. Accordingly, by utilizing a two dimensional electron gas (2DEG) at a hetero interface, a hetero junction field-effect transistor (HFET) with a large current density can be realized. With this as a background, power transistors using nitride semiconductor exhibiting advantages in increasing output and a breakdown voltage have been currently under active research and development.

FIG. 15 is a cross-sectional view of a known field-effect transistor using an AlGaN/GaN hetero structure. In the known field-effect transistor shown in FIG. 15, a low temperature GaN buffer layer 5502, an undoped GaN layer 5503 and an n-type AlGaN layer 5504 are formed in this order over a sapphire substrate 5501. A source electrode 5505 and a drain electrode 5506 are formed on the n-type AlGaN layer 5504. Each of the source electrode 5505 and the drain electrode 5506 is formed of a Ti layer and an Al layer on the n-type AlGaN layer 5504. A gate electrode 5507 is formed of a Ni layer, a Pt layer and an Au layer so as to be located between the source electrode 5505 and the drain electrode 5506. To provide isolation, part of the n-type AlGaN layer 5504 located in other part than a formation region is removed, for example, by dry etching. The field-effect transistor is a so-called normally ON type FET in which a drain current flows when a gate voltage is 0 V due to a high-concentration two dimensional electron gas generated at the hetero interface between the n-type AlGaN layer 5503 and the undoped GaN layer 5504.

However, when a GaN based HFET is applied to a power transistor, if the GaN based HFET is a normally ON type device, a safety problem might arise. For example, a circuit might be broken at the time of power failure, or the like event might be caused. Therefore, in order to make such a device be practically used as a power transistor, a GaN based HFET have to be a so-called normally OFF type FET in which a current does not flow with a gate voltage of 0 V applied. As a device structure which can satisfy the above-described requirements for known GaAs based compound semiconductor, a junction field-effect transistor (JEFT) using a pn junction as a gate has been proposed and also has been already in practical use (see J. K. Abrokwah et al., IEEE Transactions on Electron Devices, vol. 37, no. 6, pp. 1529-1531, 1990). In a JFET structure, a pn junction with a larger built-in potential than that of a Schottky junction is used as a gate and thus a gate turn-on voltage (a voltage at which a gate current starts flowing) can be increased and a gate leakage current can be reduced. In recent years, an example where adoption of the JFET structure for nitride semiconductor is studied has been reported (see L. Zhang et al., IEEE Transactions on Electron Devices, vol. 47, no. 3, pp. 507-511, 2000 and Japanese Laid-Open Publication No. 2004-273486).

SUMMARY OF THE INVENTION

However, to make the known GaN based HFET be a normally OFF type, an Al composition ratio in the n-type AlGaN layer has to be reduced or a thickness of the n-type AlGaN layer has to be reduced to reduce the amount of polarization charge. Therefore, it has been difficult to obtain a large current density and achieve the GaN based HFET being a normally OFF type at the same time.

In view of the above-described problems, it is therefore an object of the present invention to provide a field-effect transistor of normally OFF type nitride semiconductor, which is applicable to a power transistor and allows a sufficient large current density, and a method for fabricating the field-effect transistor.

To solve the above-described problems, a field-effect transistor according to the present invention includes: a substrate; a first nitride semiconductor layer formed above the substrate; a second nitride semiconductor layer which induces the generation of a two dimensional electron gas at an interface with the first nitride semiconductor layer in an ON state, the second nitride semiconductor layer being formed on the first nitride semiconductor layer and having a larger band gap energy than that of the first nitride semiconductor layer; a third nitride semiconductor layer of a p-type conductivity formed on the second nitride semiconductor layer; a gate electrode formed on or above the third nitride semiconductor layer; and source and drain electrodes formed on or above the second nitride semiconductor layer so as to be located on both sides of the gate electrode, respectively, when viewed from the top.

In this structure, the third nitride semiconductor layer has the p-type conductivity and a two dimensional electron gas is generated in the interface between the first nitride semiconductor layer and the second nitride semiconductor layer in an ON state, so that a pn junction is formed in a gate region. Thus, even though a higher gate voltage than that in the known field-effect transistor is applied to the field-effect transistor of the present invention, a gate leakage current hardly flows therein and a large drain current can be achieved. In this case, the gate electrode is preferably an Ohmic electrode.

The field-effect transistor of the present invention can be made to be a normally OFF type. Specifically, if the second nitride semiconductor layer is an undoped layer, a normally OFF type HFET can be realized in a simple manner.

In one embodiment of the present invention, part of the second nitride semiconductor layer located immediately below the gate electrode has a larger thickness than that of parts of the second nitride semiconductor layer located immediately below the source and drain electrodes. Thus, a region where electric fields concentrate in an ON state is located in the second nitride semiconductor layer, so that a breakdown voltage can be largely improved.

A method for fabricating a field-effect transistor according to the present invention includes the steps of: a) epitaxially growing a first nitride semiconductor layer, a second nitride semiconductor layer and a p-type third nitride semiconductor layer in this order above a substrate; b) selectively removing part of the third nitride semiconductor layer and part of an upper portion of the second nitride semiconductor layer and generating a two dimensional electron gas in part of an interface between the first and second nitride semiconductor layers located immediately below a region from which each of the parts of the second and third nitride semiconductor layers has been removed; c) forming a source electrode and a drain electrode so that each of the source electrode and the drain electrode is located on a region of the second nitride semiconductor layer from which the part of the upper portion thereof have been removed in the step b), respectively; and d) forming a gate electrode on or above the third nitride semiconductor layer.

Using this method, a field-effect transistor in which a two dimensional electron gas is generated in part of an interface between the first and second nitride semiconductor layers located below each of a source electrode and a drain electrode and a two dimensional electron gas is not generated in a region located below the gate electrode can be fabricated. Specifically, according to the method of the present invention, a large current can be achieved in an ON state and also a normally OFF type field-effect transistor can be fabricated. In a field-effect transistor fabricated according to the method of the present invention, a pn junction is formed in a gate region, so that even though a large voltage is applied to the gate electrode, a gate leakage current is hardly generated. Therefore, a larger ON current than that in the known field-effect transistor can be obtained.

As described above, in the field-effect transistor of the present invention, a gate turn-on voltage can be made to be at a large value corresponding to a band gap of a semiconductor, so that a large drain current can be obtained. Also, a field-effect transistor with a small gate leakage current can be realized. Moreover, an n-type impurity is selectively introduced into parts of a nitride semiconductor layer located under a source electrode and a drain electrode, respectively, so that a source resistance and a drain resistance can be reduced. Thus, a field-effect transistor with a small series resistance can be realized. Furthermore, by forming two or more n-type regions having different impurity concentrations between the gate electrode and the drain electrode, when a high voltage is applied to the drain electrode, a depletion layer extends in an n-type region having a lower impurity concentration, so that a breakdown voltage is increased.

DESCRIPTION OF THE PREFERRED EMBODIMENTS

Hereafter, embodiments of the present invention will be described with reference to the accompanying drawings.

(First Embodiment)

Figure 1:
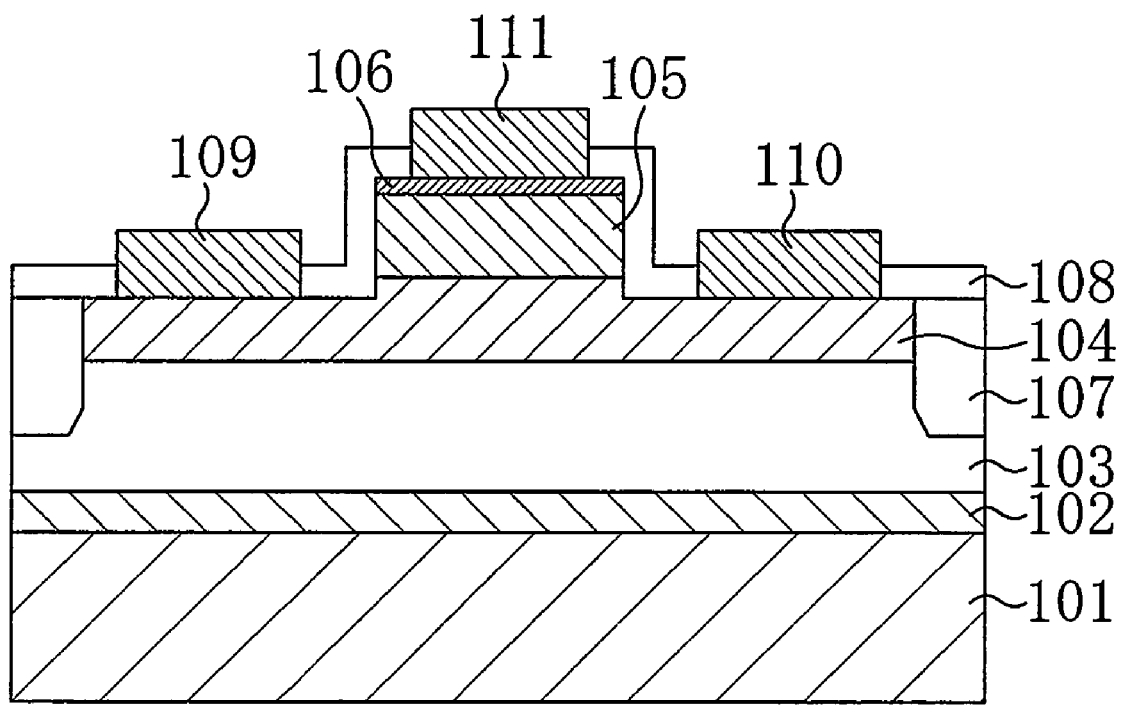
FIG. 1 is a cross-sectional view of a field-effect transistor according to a first embodiment of the present invention.

FIG. 1 is a cross-sectional view of a field-effect transistor according to a first embodiment of the present invention.

As shown in FIG. 1, the field-effect transistor of this embodiment includes a sapphire substrate 101, an AlN buffer layer 102 formed on the sapphire substrate 101 so as to have a thickness of 100 nm, an undoped GaN layer 103 formed on the AlN buffer layer 102 so as to have a thickness of 2 μm, an undoped AlGaN layer 104 formed on the undoped GaN layer 103 so as to have a thickness of 25 nm, a p-type GaN layer 105 formed on part of the undoped AlGaN layer 104 so as to have a thickness of 100 nm, and a heavily doped p-type GaN layer 106 formed on the p-type GaN layer 105 so as to contain a p-type impurity at a higher concentration than that of the p-type GaN layer 105 and have a thickness of 5 nm. Herein, "undoped" means a state in which an impurity is not intentionally doped. In the field-effect transistor of this embodiment, the undoped AlGaN layer 104 is formed of, for example, undoped $Al_{0.25}Ga_{0.75}N$.

On the heavily doped p-type GaN layer 106, provided is a gate electrode 111 of Pd (palladium) which forms an ohmic junction with the heavily doped layer GaN layer 106. An SiN film 108 having openings is provided over the undoped AlGaN layer 104 as well as side surfaces of the p-type GaN layer 105 and side and upper surfaces of the heavily doped p-type GaN layer 106. A source electrode 109 and a drain electrode 110, each of which is formed of a Ti layer and an Al layer, are formed on parts of the AlGaN layer 104 corresponding to the openings of the SiN film 108 so that the p-type GaN layer 105 is located between the source electrode 109 and the drain electrode 110. Moreover, assume that a region of the substrate in which a field-effect transistor is formed is called "device formation region". Then, an isolation region 107 is provided so as to surround a device formation region.

Parts of the heavily doped p-type GaN layer 106 and the p-type GaN layer 105 located in other part than a gate region is removed by selective etching. Part of the undoped AlGaN layer 104 is also removed by selective etching and a thickness of the undoped AlGaN layer 104 is larger in the gate region than in other part thereof. Each of the source electrode 109 and the drain electrode 110 is formed on the undoped AlGaN layer 104 of which part has been etched. In this manner, a contact face between the undoped AlGaN layer 104 and each of the source electrode and the drain electrode is located lower than a hetero interface between the p-type GaN layer 105 and the undoped AlGaN layer 104 in the gate region, so that a lower edge of a gate step at which a field intensity becomes maximum when a high drain voltage is applied is located in the AlGaN layer having a large band gap. Therefore, compared to the case where the entire upper surface of the undoped AlGaN layer 104 is flat, a breakdown voltage between the gate and drain electrodes can be improved. Even when the upper surface of the undoped AlGaN layer 104 is flat and the p-type GaN layer 105 having a small thickness is interposed between the undoped AlGaN layer 104 and each of the source electrode 109 and the drain electrode 110, the field-effect transistor of the present invention can be operated as a transistor without any problem. Moreover, part of the undoped AlGaN layer 104 which is in contact with the source electrode 109 and the drain electrode 110 has a smaller thickness than that of part of the undoped AlGaN layer 104 located in the gate region, and accordingly, a distance between a two dimensional electron gas and each of the source electrode 109 and the drain electrode 110 is small. Thus, an ohmic contact resistance at the interface between the undoped AlGaN layer 104 and each of the source electrode 109 and the drain electrode 110 can be reduced. However, if the thickness of the part of the undoped AlGaN layer 104 with which the source and drain electrodes are in contact becomes too small, a channel resistance between the gate and source electrodes or between the gate and drain electrodes is increased. Therefore, the undoped AlGaN layer 104 preferably has a thickness of about 10 nm or more.

Figure 15:
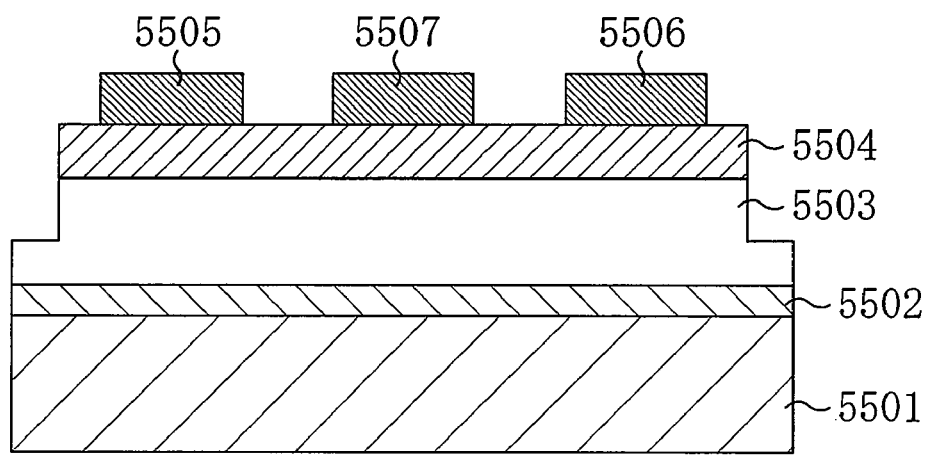
FIG. 15 is a cross-sectional view of a known field-effect transistor using an AlGaN/GaN hetero structure.

The isolation region 107 is formed, for example, by performing ion implantation of B (boron) into parts of the undoped AlGaN layer 104 and the undoped GaN layer 103 so that a resistance thereof is increased. Thus, a step between the device formation region and the isolation region 107 is not created. In the known field-effect transistor of FIG. 15, when steps are created by dry etching for the purpose of isolating one device from another, crystal defects are generated due to etching. This causes the generation of a leakage current through the crystal defects in the steps. In contrast, in the field-effect transistor of this embodiment, leakage current between the source and the drain and leakage current between devices are largely reduced.

In a GaN based HFET, a so-called current collapse in which when a drain voltage is increased, a drain current is reduced is a problem in many cases. However, in the field-effect transistor of this embodiment, an upper surface of the transistor is covered with the SiN film 108, except for part of the source, drain and gate electrodes, so that a surface level is reduced and the generation of current collapse is suppressed.

To suppress the expansion of a depletion layer into the p-type GaN layer 105, a carrier concentration in the p-type GaN layer 105 is preferably $1 \times 10^{18}$ cm$^{-3}$ or more. In the field-effect transistor of this embodiment, the carrier concentration in the p-type GaN layer 105 is set to be $1 \times 10^{18}$ cm$^{-3}$. Thus, in the field-effect transistor of this embodiment, the concentration of a two dimensional electron gas generated at the interface between the undoped AlGaN layer 104 and the undoped GaN layer 103 is about $1 \times 10^{13}$ cm$^{-2}$. With the carrier concentration in the p-type GaN layer 105 having a thickness of 100 nm set to be $1 \times 10^{18}$ cm$^{-3}$, the two dimensional electron gas generated at the interface between the undoped AlGaN layer 104 and the undoped GaN layer 103 can be cancelled out, so that the field-effect transistor can be made to be a normally OFF type. In this case, if the number of carries per sheet in the p-type GaN layer 105 is equal to or larger than the number of electrons of the two dimensional electron gas, the two dimensional electron gas can be cancelled out. In order to adjust the field-effect transistor to make it be a normally OFF type, besides adjusting the concentration of an impurity, the thickness of the undoped AlGaN layer 104 may be adjusted.

The field-effect transistor of this embodiment is characterized in that the gate electrode 111 forms an Ohmic contact with the heavily doped p-type GaN layer 106 and thus a pn junction is formed by a two dimensional electron gas and p-type GaN layer 105 at an interface between the undoped AlGaN layer 104 and an undoped GaN layer 103. Since a pn junction barrier is larger than a Schottky junction barrier, even with a higher gate voltage than that in the known field-effect transistor applied, gate leakage is hardly caused in the field-effect transistor.

In the field-effect transistor of this embodiment, the heavily doped p-type GaN layer 106 having a small thickness is provided under the gate electrode 111, so that an Ohmic contact can be easily formed between the heavily doped p-type GaN layer 106 and the gate electrode 111. In general, p-type GaN based semiconductor less likely to form an Ohmic contact, compared to p-type GaAs based semiconductor. Therefore, it is not necessary that the heavily doped p-type GaN layer 106 is provided but it is preferable that the heavily doped p-type GaN layer 106 is provided. A material having a large work function is preferable for a gate electrode. For example, besides Pd, Ni and the like can be used.

Figure 2A:
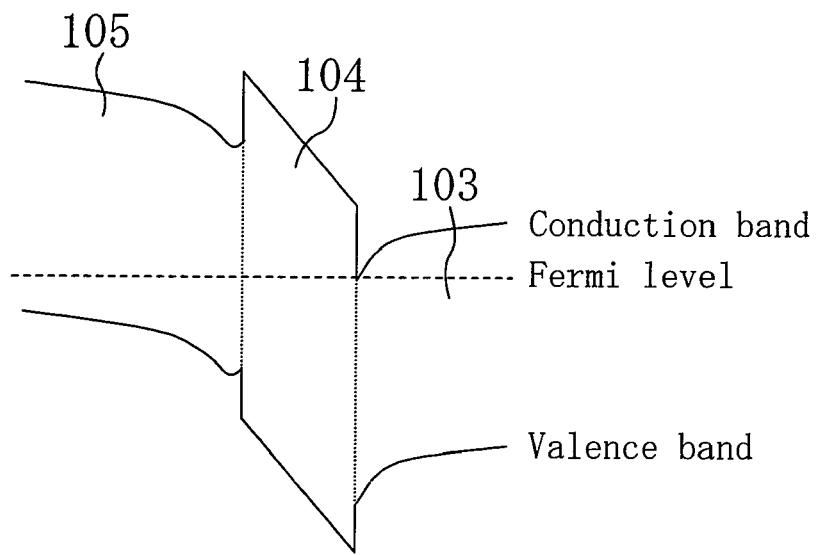
FIG. 2A is an energy band diagram of a vertical section in a gate region of the field-effect transistor of the first embodiment.
Figure 2B:
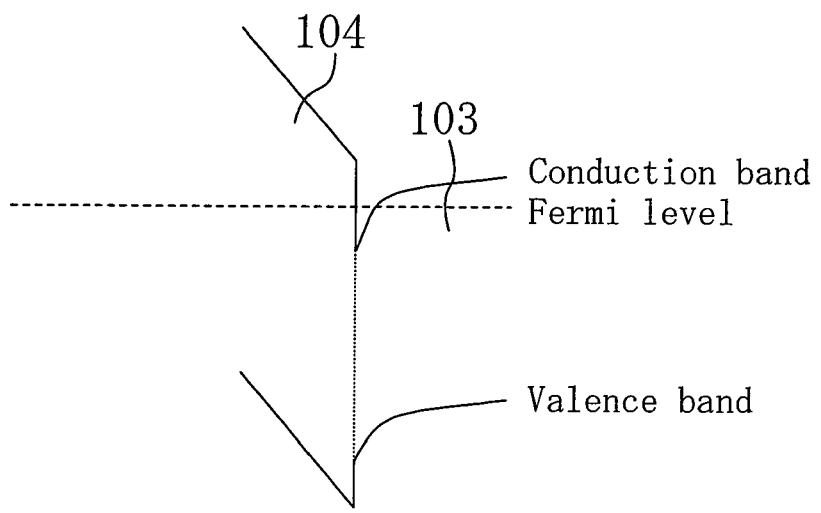
FIG. 2B is an energy band diagram of a vertical section in a region located between the gate region and the source region in the field-effect transistor of the first embodiment.

FIG. 2A is an energy band diagram of a vertical section in a gate region of the field-effect transistor of this embodiment. FIG. 2B is an energy band diagram of a vertical section of a region located between the gate region and the source region in the field-effect transistor of this embodiment.

As shown in FIGS. 2A and 2B, at the hetero interface between the undoped AlGaN layer and the undoped GaN layer, i.e., an undoped layer-to-undoped layer junction, a well is formed in a conduction band due to charges generated by spontaneous polarization and piezoelectric polarization. As shown in FIG. 2B, in other device regions than the gate region, the p-type GaN layer 105 is not connected onto the undoped AlGaN layer 104, so that a well in this conductive band is located lower than a fermi level and a two dimensional electron gas is formed even in a state where a gate voltage is not applied. However, in the gate region, as shown in FIG. 2A, the p-type GaN layer 105 is connected to the undoped AlGaN layer 104. Thus, the respective energy levels of the undoped AlGaN layer 104 and the undoped GaN layer 103 are raised, so that a well in a conduction band at the hetero interface between the undoped AlGaN layer 104 and the undoped GaN layer 103 is formed substantially at the same location as that of the fermi level. As a result, when a bias is not applied to the gate electrode, a two dimensional electron gas is not formed in the gate region, so that the field-effect transistor is becomes normally OFF state. As described above, a two dimensional electron gas is generated in other device formation regions than the gate region, so that a large current flows between the source and the drain when a positive bias is applied.

Moreover, when a positive bias is applied to the gate electrode, the larger a band gap of semiconductor used for the transistor is, the larger a value for a gate voltage (gate turn-on voltage) at which a gate current starts flowing becomes. As the gate turn-on voltage becomes larger, a larger positive bias can be applied to the gate electrode. Therefore, the value for the gate voltage is preferably large. When GaAs or like semiconductor is used, the gate turn-on voltage is about 1 V. In the present invention in which GaN based semiconductor is used, the value of the gate turn-on voltage corresponds to a band gap of the semiconductor and thus is a large value.

Figure 3A:
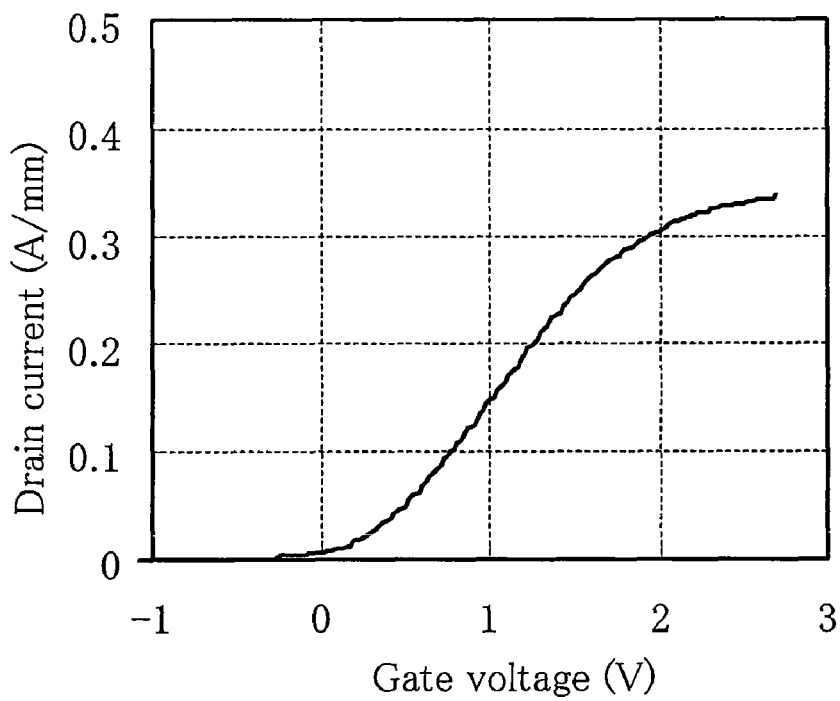
FIGS. 3A and 3B are graphs showing the relationship between gate voltage and drain current and the relationship between drain current and drain voltage in the field-effect transistor of the first embodiment, respectively.
Figure 3B:
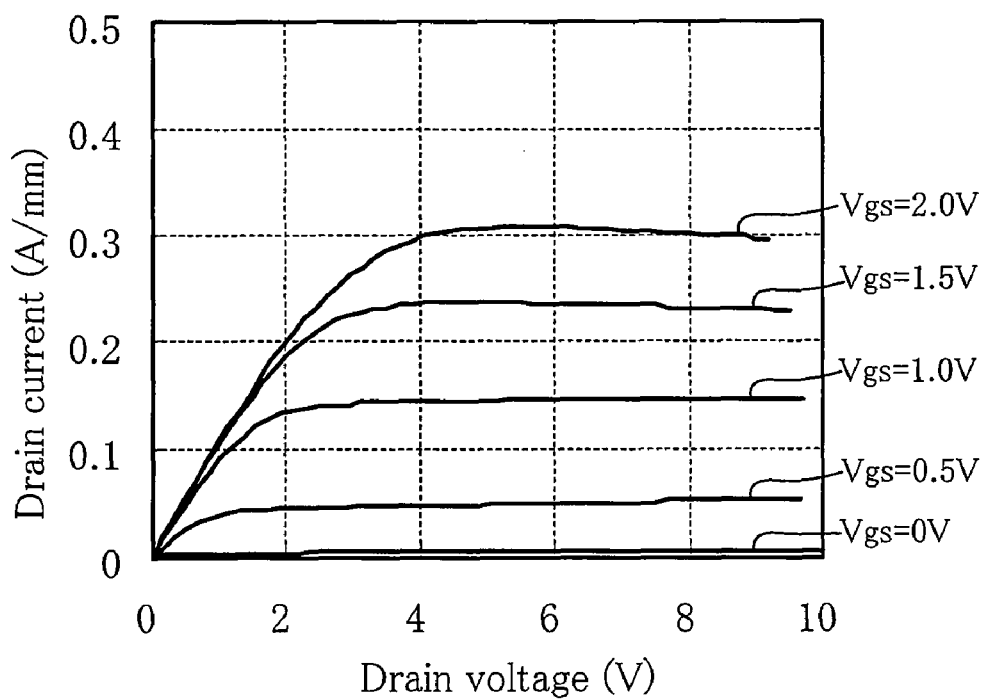

FIGS. 3A and 3B are graphs showing the relationship between gate voltage and drain current and the relationship between drain current and drain voltage in the field-effect transistor of this embodiment, respectively. As seen in FIG. 3A, in the field-effect transistor of the present invention, a threshold voltage is about 0 V and a normally OFF state is realized. Also, since the gate turn-on voltage is large, almost no gate leakage current flows even with a positive bias of 2 V applied to the gate electrode 111 and, as shown in FIG. 3B, a maximum drain current of 300 mA/mm or more can be achieved.

In the description above, an example where with the (0001) plane of the sapphire substrate 101, a field-effect transistor is formed has been shown. However, for example, a field-effect transistor may be formed on a (10-12) plane (R plane) of the sapphire substrate. In such a case, a polarization electric field is not generated in the direction in which nitride semiconductor grows and the sheet carrier concentration of a two electron gas can be controlled in a simple manner, so that a normally OFF type field-effect transistor can be fabricated in a simple manner. Specifically, to obtain a larger positive value for the threshold voltage, a field-effect transistor is not formed on the (0001) plane (i.e., c plane) of the sapphire substrate 101 but a field-effect transistor is preferably formed using a substrate with which a nonpolar property can be achieved. Also, at the same time, an n-type AlGaN layer may be provided, instead of the undoped AlGaN layer 104.

As a field-effect transistor according to this embodiment, an example where the undoped AlGaN layer 104 is formed of $Al_{0.25}Ga_{0.75}N$ has been described. However, the composition ratio between Al and Ga is not limited thereto. An undoped AlN layer may be provided, instead of the undoped AlGaN layer 104. In such a case, since a band diagram varies when the composition of the undoped AlGaN layer 104 is changed, a film thickness, an impurity concentration and the like for each layer need to be adjusted so that a threshold becomes 0 V or more.

(Second Embodiment)

Figure 4:
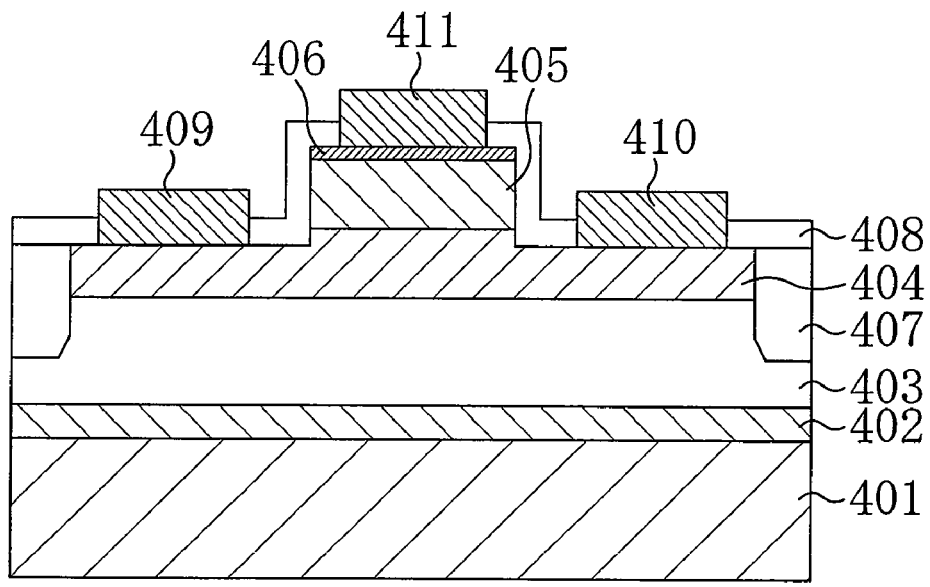
FIG. 4 is a cross-sectional view of a field-effect transistor according to a second embodiment of the present invention.

FIG. 4 is a cross-sectional view of a field-effect transistor according to a second embodiment of the present invention.

As shown in FIG. 4, the field-effect transistor of this embodiment includes a sapphire substrate 401, an AlN buffer layer 402 formed on the sapphire substrate 401 so as to have a thickness of 100 nm, an undoped GaN layer 403 formed of the AlN buffer layer 402 so as to have a thickness of 2 μm, an undoped AlGaN layer 404 formed on the undoped GaN layer 403 so as to have a thickness of 25 nm, a p-type AlGaN layer 405 formed on part of the undoped AlGaN layer 404 so as to have a thickness of 100 nm, and a heavily doped p-type GaN layer 406 formed on the p-type AlGaN layer 405 so as to have a thickness of 5 nm. The field-effect transistor of this embodiment further includes a gate electrode 411 formed of Pd which forms an Ohmic contact with the heavily doped p-type GaN layer 406, a source electrode 409 and a drain electrode 410 each of which forms an Ohmic contact with the undoped AlGaN layer 404 and is formed of a Ti layer and an Al layer, and a SiN film 408. A device formation region is electrically isolated from adjacent devices by an isolation region 407.

The field-effect transistor of this embodiment is different from the field-effect transistor of the first embodiment in that the p-type AlGaN layer 405 is provided, instead of the p-type GaN layer 105. Other than that, the field-effect transistor of this embodiment has the same structure as that of the first embodiment. The p-type AlGaN layer 405 is formed of a material having the same composition as that of the undoped AlGaN layer 404. For example, the p-type AlGaN layer 405 is formed of $Al_{0.25}Ga_{0.75}N$.

Figure 5:
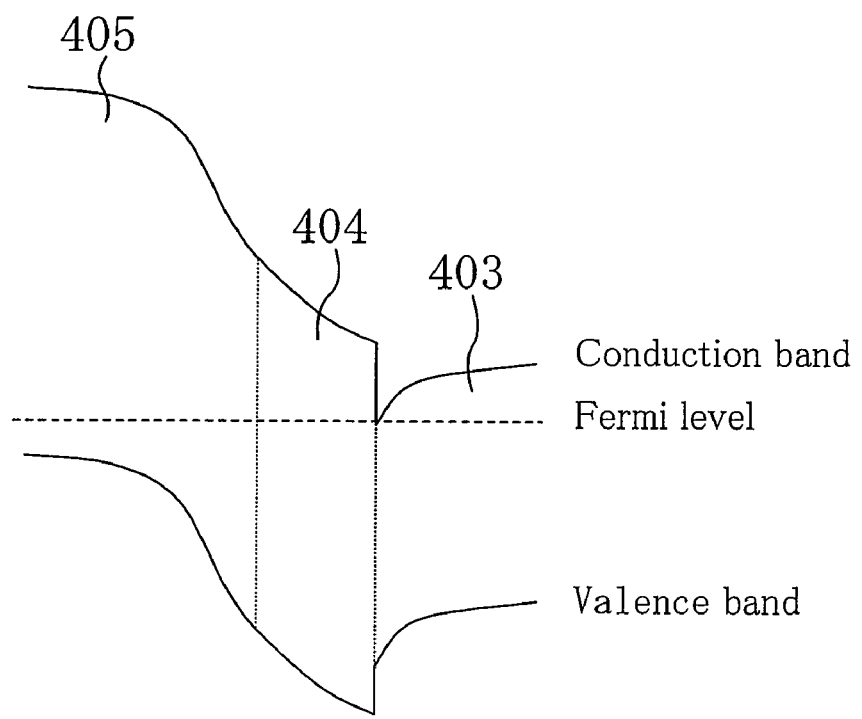
FIG. 5 is an energy band diagram of a vertical section in a gate region of the field-effect transistor of the second embodiment.

FIG. 5 is an energy band diagram of a vertical section in a gate region of the field-effect transistor of this embodiment.

As shown in FIG. 5, in the field-effect transistor of this embodiment, the p-type AlGaN layer 405 and the undoped AlGaN layer 404 are formed of the same material. Thus, band discontinuity does not occur in an interface between the two layers. Compared to this, in the field-effect transistor of the first embodiment shown in FIG. 2, band discontinuity occurs at a hetero interface between the p-type GaN layer and the undoped AlGaN layer. Therefore, the field-effect transistor of this embodiment is made to have a structure in which holes are not stored at the interface between the p-type AlGaN layer 405 and the undoped AlGaN layer and the generation of a gate leakage current due to inter-band tunneling is more reliably suppressed, compared to the first embodiment. As a result, in the field-effect transistor of this embodiment, the gate turn-on voltage is higher than that of field-effect transistor of the first embodiment.

In FIG. 5, an example where a composition ratio in the p-type AlGaN layer 405 is made to be the same as that of the undoped AlGaN layer has been described. However, a p-type nitride semiconductor layer having a larger band gap than that of the undoped AlGaN layer 404 may be provided, instead of the p-type AlGaN layer 405. In such a case, band discontinuity occurs at the hetero interface between the undoped AlGaN layer 404 and the p-type AlGaN layer 405. However, a potential energy of a valence band of the p-type AlGaN layer 405 becomes smaller in the direction toward the undoped AlGaN layer 404, so that holes are not stored around the interface between the undoped AlGaN layer 404 and the p-type AlGaN layer 405.

Figure 6A:
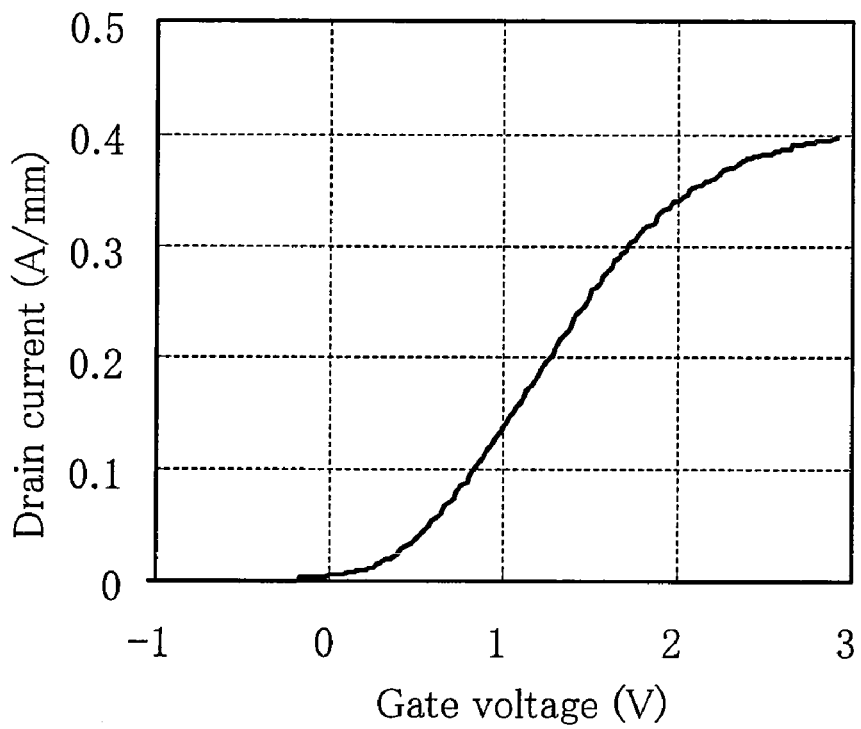
FIGS. 6A and 6B are graphs showing the relationship between gate voltage and drain current and the relationship between drain current and drain voltage in the field-effect transistor of the second embodiment, respectively.
Figure 6B:
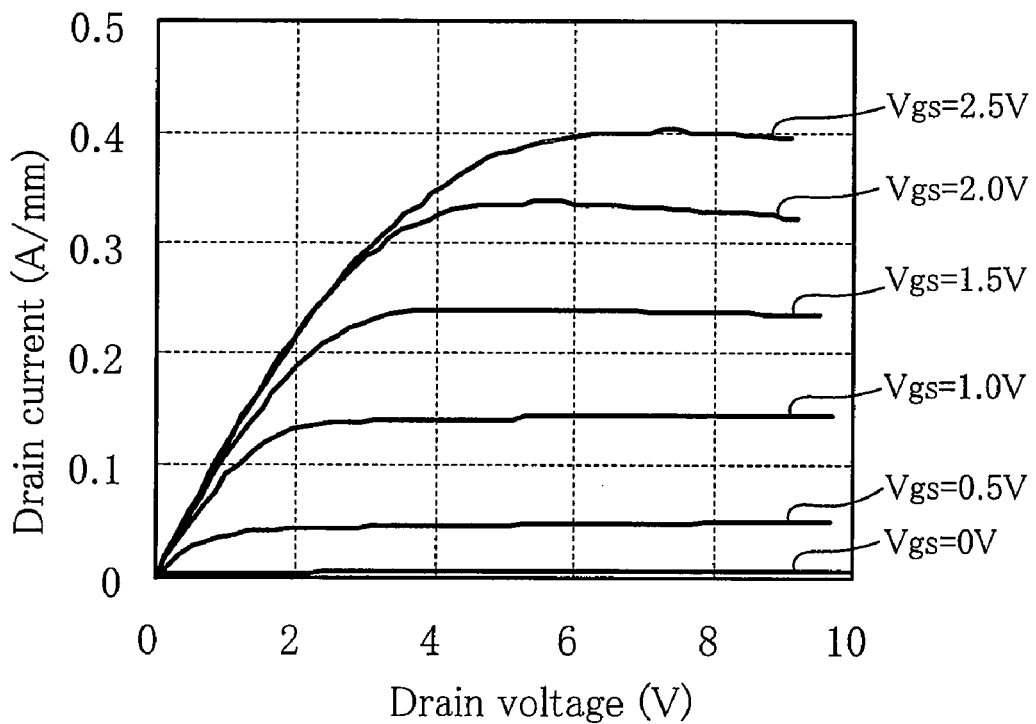

FIGS. 6A and 6B are graphs showing the relationship between gate voltage and drain current and the relationship between drain current and drain voltage in the field-effect transistor of this embodiment, respectively. As shown in FIG. 6A, a threshold voltage is about 0 V and a normally OFF state is realized. As shown in FIG. 6B, a gate leakage current is hardly generated, so that in the field-effect transistor of this embodiment, even when a gate-source voltage Vgs is increased to 2.5 V, the field-effect transistor can be operated without generating a gate leakage current.

Figure 7:
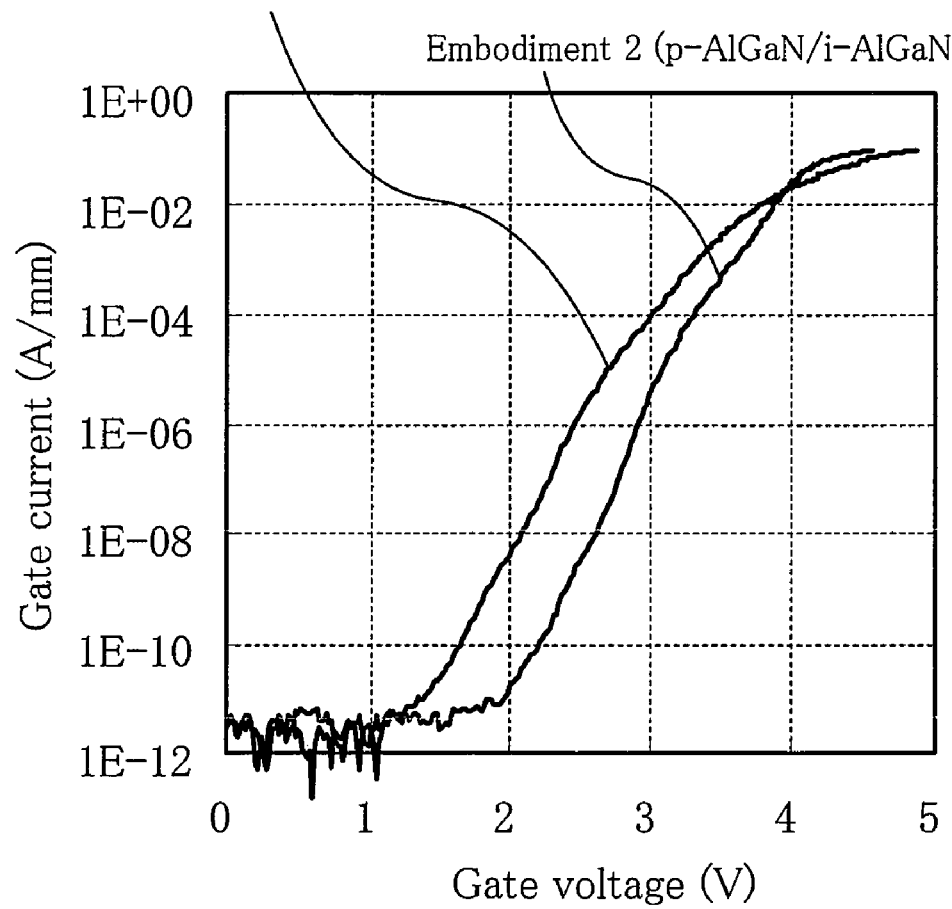
FIG. 7 is a graph showing current-voltage characteristics with respect to current flowing in the forward direction between gate and source in the field-effect transistors of the first and second embodiments of the present invention.

FIG. 7 is a graph showing current-voltage characteristics with respect to a current flowing in the forward direction between gate and source in each of the field-effect transistors of the first and second embodiments of the present invention. Results shown in FIG. 7 indicate that the gate turn-on voltage is larger in the field-effect transistor of the second embodiment than in the field-effect transistor of the first embodiment. Accordingly, in the field-effect transistor of this embodiment, a large positive bias can be applied by the gate electrode, so that a larger drain current can be achieved than in the field-effect transistor of the first embodiment.

Next, an exemplary method for fabricating the field-effect transistor of the present invention shown in FIG. 4 will be described. FIGS. 8A through 8F are cross-sectional views illustrating respective steps for fabricating the field-effect transistor of this embodiment.

Figure 8A:
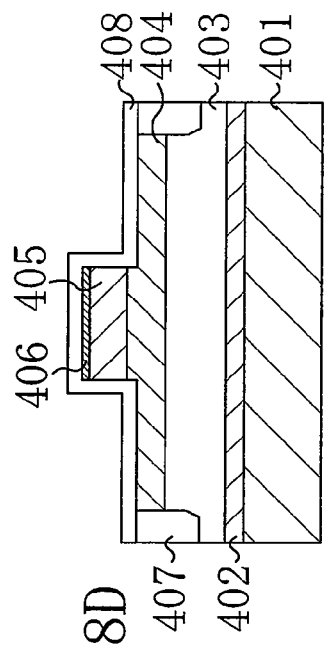
FIGS. 8A through 8F are cross-sectional views illustrating respective steps for fabricating the field-effect transistor of the second embodiment.

First, as shown in FIG. 8A, an AlN buffer layer 402 having a thickness of 100 nm, an undoped GaN layer 403 having a thickness of 2 μm, an undoped AlGaN layer 404 having a thickness of 25 nm, a p-type AlGaN layer 405 having a thickness of 100 nm, and a heavily doped p-type GaN layer 406 having a thickness of 5 nm are formed in this order on a (0001) plane of a sapphire substrate 401 by metal organic chemical vapor deposition (MOCVD).

Figure 8B:
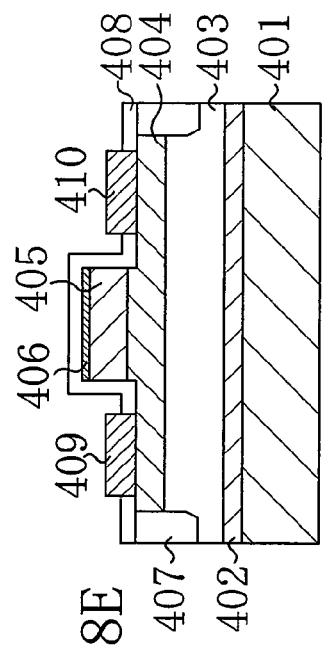

Next, as shown in FIG. 8B, parts of the heavily doped p-type GaN layer 406, the p-type AlGaN layer 405 and an upper portion of the undoped AlGaN layer 404 located in other part than the gate region are selectively removed, for example, by dry etching such as ICP (inductive-coupled plasma) etching.

Figure 8C:
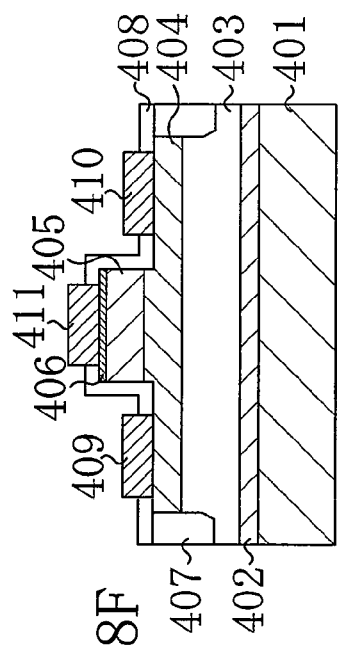

Next, as shown in FIG. 8C, with a device formation region covered with a photoresist, for example, B (boron) is ion-implanted to increase a resistance in parts of the undoped AlGaN layer 404 and the undoped GaN layer 403. Thus, an isolation region 407 is formed.

Figure 8D:
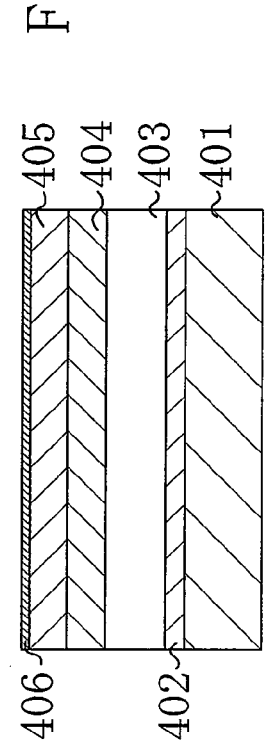

Subsequently, as shown in FIG. 8D, chemical vapor deposition (CVD) is performed using $SiH_4$, $NH_3$ and $N_2$, thereby forming a SiN film 408 having a thickness of 100 nm.

Figure 8E:
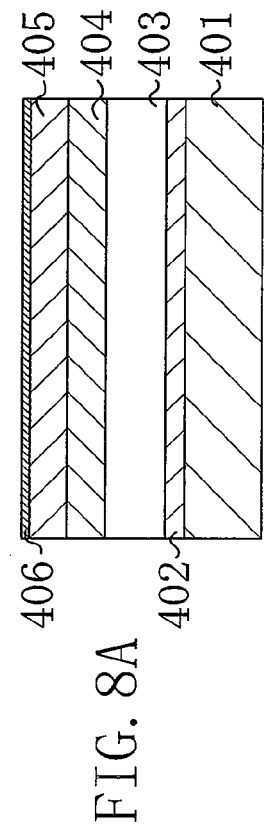

Next, as shown in FIG. 8E, openings are formed in a SiN film, for example, by ICP dry etching or the like. Each of a source electrode 490 and a drain electrode 410 is formed of a Ti layer and an Al layer in an associated one of the openings, and then heat treatment is performed thereto in an $N_2$ atmosphere at 650° C.

Figure 8F:
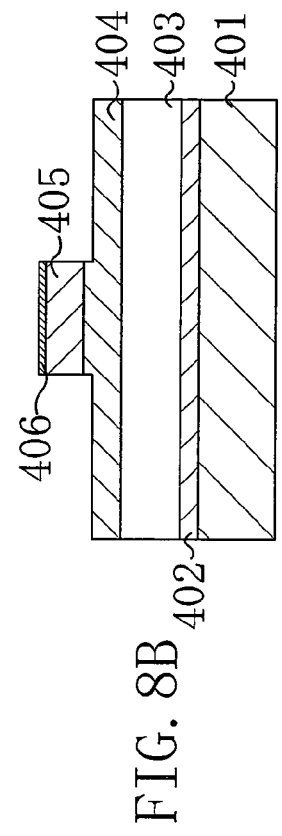

Next, as shown in FIG. 8F, part of the SiN film 408 provided on the heavily doped p-type GaN layer 406 is removed, for example, by ICP dry etching or the like. Subsequently, a gate electrode 411 of Pd is formed in an associated one of the openings in the SiN film 408. The source electrode 409, the drain electrode 410 and the gate electrode 411 may be formed before formation of the SiN film 408. The isolation region 407 may be formed after formation of the source electrode 409, the drain electrode 410 and the gate electrode 411. In the above-described manner, the field-effect transistor of this embodiment can be fabricated.

(Third Embodiment)

Figure 9:
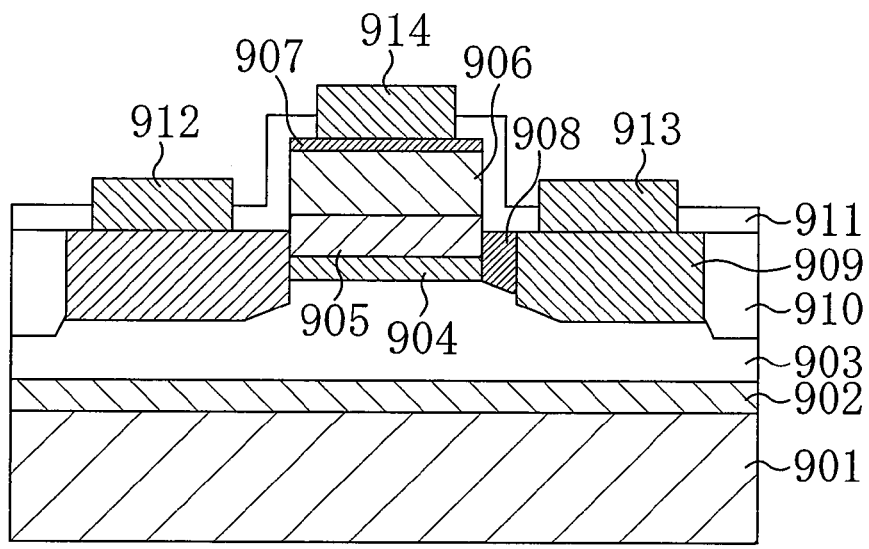
FIG. 9 is a cross-sectional view of a field-effect transistor according to a third embodiment of the present invention.

FIG. 9 is a cross-sectional view of a field-effect transistor according to a third embodiment of the present invention.

As shown in FIG. 9, the field-effect transistor of this embodiment includes a sapphire substrate 901, an AlN buffer layer 902 formed on the sapphire substrate 901 so as to have a thickness of 100 nm, an undoped GaN layer 903 formed on the AlN buffer layer 902 so as to have a thickness of 2 μm, an n-type GaN layer 904 formed on the undoped GaN layer 903 so as to have a thickness of 5 nm, an undoped AlGaN layer 905 formed on the n-type GaN layer 904 so as to have a thickness of 20 nm, a p-type AlGaN layer 906 formed on the undoped AlGaN layer 905 so as to have a thickness of 100 nm, and a heavily doped p-type GaN layer 907 formed on the p-type AlGaN layer 906 so as to have a thickness of 5 nm. The field-effect transistor of this embodiment further includes heavily doped n-type regions 909 defined in parts located at both sides of the n-type GaN layer 904, respectively, and on the undoped GaN layer 903 and containing an n-type impurity at a higher concentration than that of the n-type GaN layer 904, a lightly doped n-type region 908 defined in part located between each of the n-type GaN layer 904 and the undoped AlGaN layer 905 and one of the heavily doped regions 909 (drain region) and containing an n-type impurity at a lower concentration than that of the heavily doped n-type region 909, and a source electrode 912 and a drain electrode 913 formed of Ti/Al and provided on the heavily doped n-type regions 909, respectively. In the field-effect transistor of this embodiment, as in the field-effect transistors of the first and second embodiments, an isolation region 910, a gate electrode 914 formed of Pd, and a SiN film 911 are provided.

In the field-effect transistor of this embodiment, since the heavily doped n-type regions 909 are formed by Si ion implantation, Ohmic contact resistances generated between the source electrode 912 and one of the heavily doped regions 909 and between the drain electrode 913 and the other of the heavily doped regions 909 are largely reduced, so that a source resistance and a drain resistance are small. Therefore, the field-effect transistor of this embodiment is a normally OFF type and, at the same time, allows a large current flowing therein when it is operated. Moreover, power consumption is reduced, compared to the known field-effect transistor. To sufficiently reduce ohmic contact resistances, a carrier concentration of the heavily doped n-type region is preferably $2 \times 10^{18}$ $cm^{-3}$ or more.

A carrier concentration of the lightly doped n-type region 908 is, for example, about $1 \times 10^{17}$ $cm^{-3}$. The lightly doped n-type region 908 is formed in part located between each of the n-type GaN layer 904 and the undoped AlGaN layer 905 and one of the heavily doped regions 909 located in the drain electrode side, so that concentration of electric fields in the heavily doped n-type region on the drain side caused when a high voltage is applied to the drain electrode can be prevented. Thus, a breakdown voltage can be increased.

Figure 10:
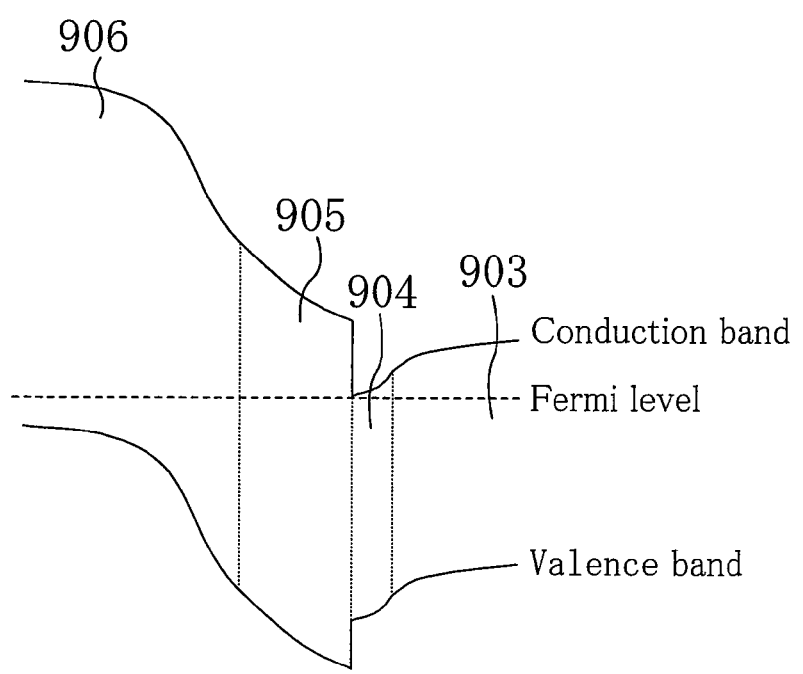
FIG. 10 is an energy band diagram of a vertical section in a gate region of the field-effect transistor of the third embodiment.

FIG. 10 is an energy band diagram of a vertical section in a gate region of the field-effect transistor of this embodiment.

As shown in FIG. 10, in the field-effect transistor of this embodiment, an n-type GaN layer 904 for functioning as a channel is inserted between the undoped GaN layer 903 and the undoped AlGaN layer 905. Therefore, the width of a well in a conduction band at a hetero interface between the undoped AlGaN layer 905 and the n-type GaN layer 904 in which carriers travel is greater than that in the case where the n-type GaN layer 904 is not inserted. Accordingly, a channel resistance when a positive bias is applied to the gate electrode 914 and the field-effect transistor is turned ON becomes small, so that a large drain current can be taken out.

Next, an exemplary method for fabricating the field-effect transistor of this embodiment shown in FIG. 9 will be described. FIGS. 11A through 11G are cross-sectional views illustrating respective steps for fabricating the field-effect transistor of this embodiment.

Figure 11E:
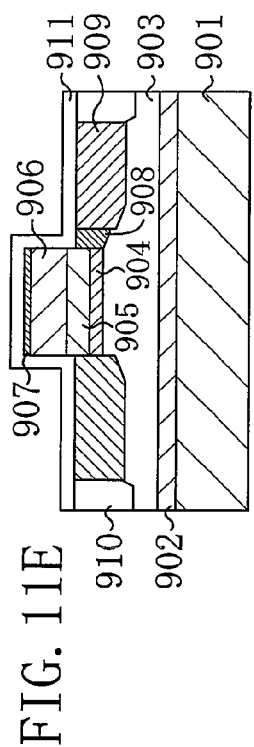
FIGS. 11A through 11G are cross-sectional views illustrating respective steps for fabricating the field-effect transistor of the third embodiment.
Figure 11F:
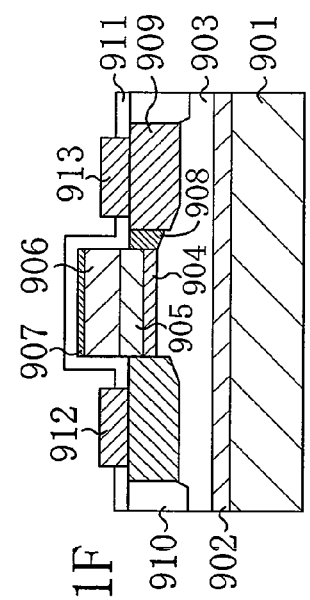
Figure 11G:
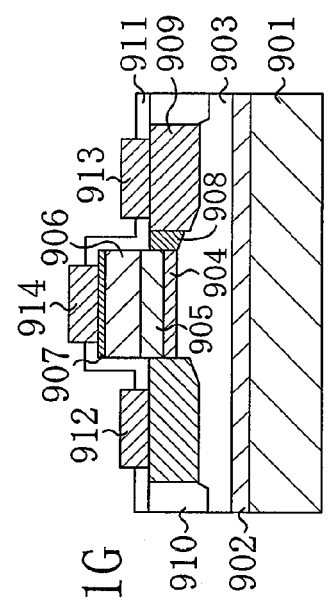
Figure 11A:
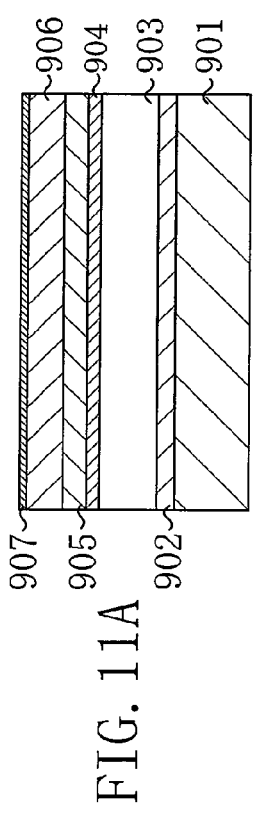

First, as shown in FIG. 11A, an MN buffer layer 902 having a thickness of 100 nm, an undoped GaN layer 903 having a thickness of 2 μm, an n-type GaN layer 904 having a thickness of 5 nm, an undoped AlGaN layer 905 having a thickness of 20 nm, a p-type AlGaN layer 906 having a thickness of 100 nm, and a heavily doped p-type GaN layer 907 having a thickness of 5 nm are formed in this order on a (0001) plane of a sapphire substrate 901 by MOCVD.

Figure 11B:
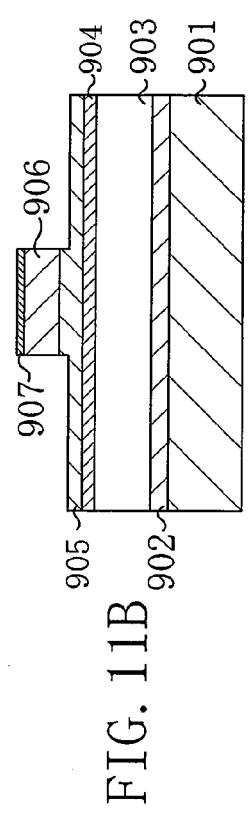

Next, as shown in FIG. 11B, parts of the heavily doped p-type GaN layer 907, the p-type AlGaN layer 906 and an upper portion of the undoped AlGaN layer 905 located in other part than the gate region are selectively removed, for example, by dry etching such as ICP etching.

Figure 11C:
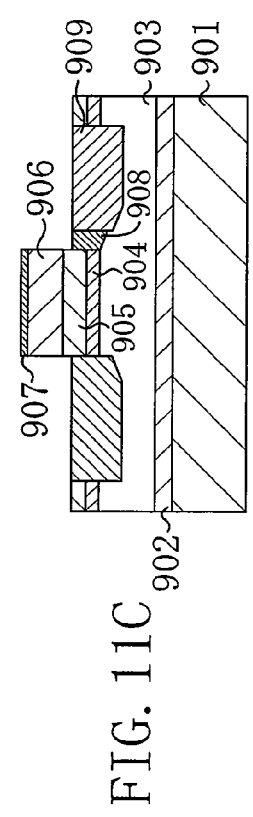

Next, as shown in FIG. 11C, Si ions are implanted in regions of the substrate located on the both sides of the gate region, respectively, and then an impurity is activated by heat treatment in an $N_2$ atmosphere. Thus, a lightly doped n-type region 908 and a heavily doped n-type region 909 are formed.

Figure 11D:
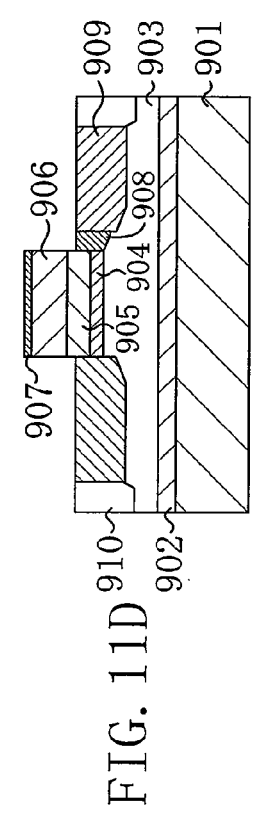

Subsequently, as shown in FIG. 11D, for example, B (boron) is ion-implanted in parts of the undoped AlGaN layer 905, the n-type GaN layer 904 and the undoped GaN layer 903 to increase a resistance therein. Thus, an isolation region 910 is formed.

Next, as shown in FIG. 11E, CVD is performed using $SiH_4$, $NH_3$ and $N_2$, thereby forming a SiN film 911 having a thickness of 100 nm on the substrate.

Next, as shown in FIG. 11F, part of the SiN film 911 located on the heavily doped n-type region 909 is removed, for example, by ICP dry etching or the like. Subsequently, each of a source electrode 912 and a drain electrode 913 is formed of a Ti layer and an Al layer in an associated one of openings in the SiN film 911, and then heat treatment is performed thereto in an $N_2$ atmosphere at 650° C.

Next, as shown in FIG. 11G, part of the SiN film 911 located on the heavily doped p-type GaN layer 907 is removed, for example, by ICP dry etching or the like. Subsequently, a gate electrode 914 is formed of Pd in an associated one of the openings in the SiN film 911. In this embodiment, a method for forming the SiN film 911 is formed before formation of the electrodes has been described. However, the SiN film 911 may be formed after formation of the electrodes. In the above-described manner, the field-effect transistor of this embodiment can be fabricated.

(Fourth Embodiment)

Figure 12:
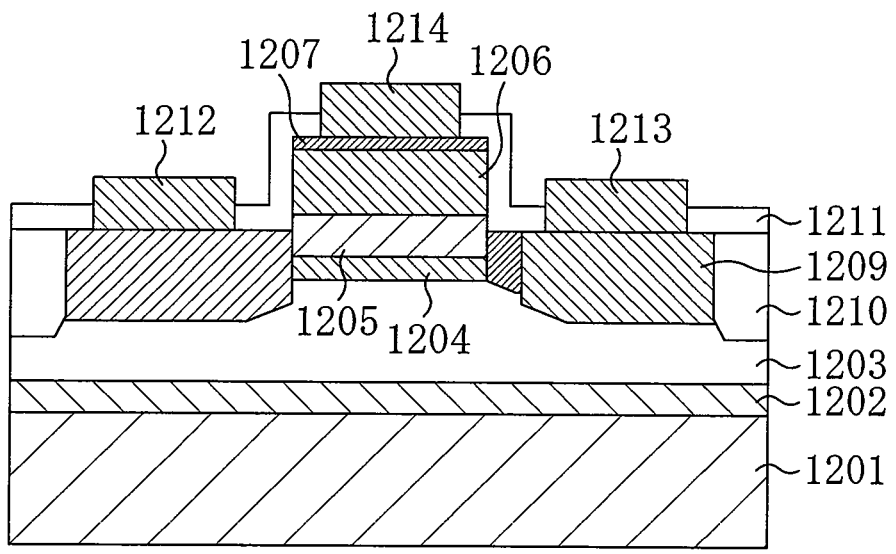
FIG. 12 is a cross-sectional view illustrating a field-effect transistor according to a fourth embodiment of the present invention.

FIG. 12 is a cross-sectional view illustrating a field-effect transistor according to a fourth embodiment of the present invention. As shown in FIG. 12, the field-effect transistor of this embodiment includes a sapphire substrate 1201, an AlN buffer layer 1202 having a thickness of 100 nm, an undoped GaN layer 1203 having a thickness of 2 µm, an n-type GaN layer 1204 having a thickness of 5 nm, an undoped AlGaN layer 1205 having a thickness of 20 nm, a p-type composition gradient AlGaN layer 1206 having a thickness of 100 nm, and a heavily doped p-type GaN layer 1207 having a thickness of 5 nm formed in this order on the sapphire substrate 1201. The field-effect transistor of this embodiment further includes a heavily doped n-type region 1209, a lightly doped n-type region 1208 containing an n-type impurity at a lower concentration than that of the heavily doped n-type region 1209, and a source electrode 1212 and a drain electrode 1213 formed of Ti/Al and provided on the heavily doped n-type regions 1209, respectively. As in the field-effect transistor of each of the first through third embodiments, in the field-effect transistor of this embodiment, an isolation region 1210, a gate electrode 1214 formed of Pd and a SiN film 1211 are provided. That is, the field-effect transistor of this embodiment is obtained by providing the p-type composition gradient AlGaN layer 1206, instead of the p-type AlGaN layer 906 in the field-effect transistor of the third embodiment.

Figure 13:
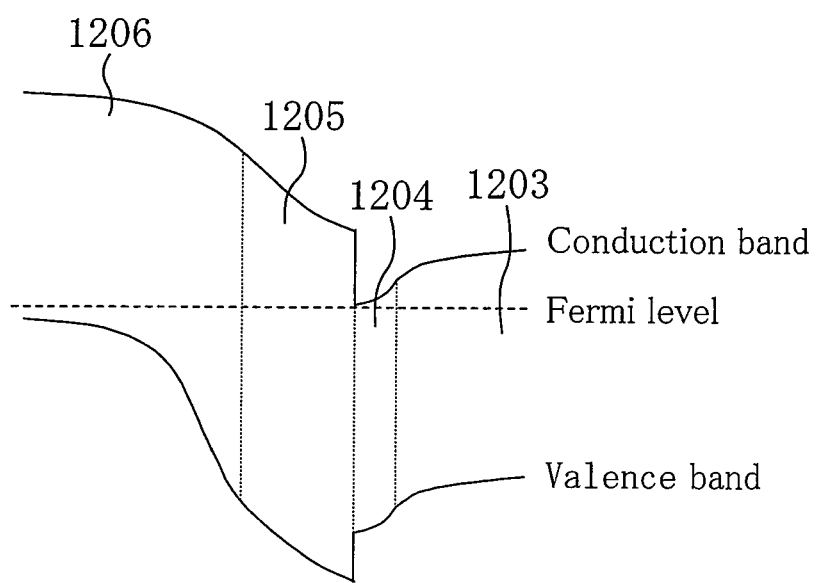
FIG. 13 is an energy band diagram of a vertical section in a gate region of the field-effect transistor of the fourth embodiment.

FIG. 13 is an energy band diagram of a vertical section in a gate region of the field-effect transistor of this embodiment. In the field-effect transistor of this embodiment, an Al composition ratio in the p-type composition gradient AlGaN layer 1206 varies such that the Al composition is the highest in part thereof located close to the sapphire substrate and becomes 0 in part thereof located close to the gate electrode. Specifically, in the p-type composition gradient AlGaN layer 1206, the respective compositions of Al and Ga gradually vary such that the composition of the p-type composition gradient AlGaN layer 1206 is the same as that of the undoped AlGaN layer 1205 at an interface with the undoped AlGaN layer 1205 and the composition thereof is the same as that of the heavily doped p-type GaN layer 1207 at the interface with the heavily doped p-type GaN layer 1207. In this embodiment, the undoped AlGaN layer 1205 is formed of for example, $Al_{0.25}Ga_{0.75}N$.

Because of the above-described structure, band discontinuity does not occur at the interface between the p-type composition gradient AlGaN layer 1206 and the undoped AlGaN layer 1205, so that a gate leakage current due to inter-band tunneling is not generated. As a result, a gate turn-on voltage becomes high, so that a large drain current can be achieved.

The p-type carrier concentration can be made larger in the GaN layer than in the AlGaN layer, so that the carrier concentration in part of the p-type composition gradient AlGaN layer 1206 located close to the gate electrode can be made higher than in part thereof located close to the substrate. As a result, an Ohmic contact with the gate electrode can be formed in a simple manner.

The Al composition ratio in part of the p-type composition gradient AlGaN layer 1206 located in the vicinity of the interface with the undoped AlGaN layer 1205 may be made larger than that in the undoped AlGaN layer 1205. In such a case, holes are not stored in the vicinity of the interface between the p-type composition gradient AlGaN layer 1206 and the undoped AlGaN, so that a gate leakage current flowing in the undoped AlGaN layer 1205 due to inter-band tunneling can be suppressed.

In this embodiment, an example where the Al composition in the p-type AlGaN layer is gradually changed has been described. However, in the case where as in the first embodiment, a p-type GaN layer is provided on an undoped AlGaN layer, an Al composition in the undoped AlGaN layer may be gradually changed so that band discontinuity at an interface between the p-type GaN layer and the undoped AlGaN layer is eliminated.

(Fifth Embodiment)

Figure 14:
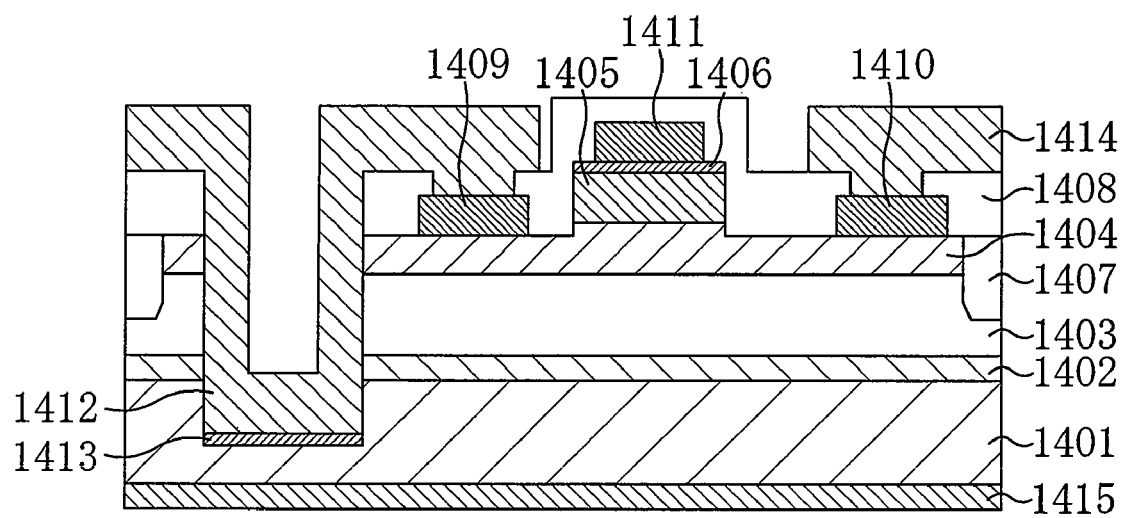
FIG. 14 is a cross-sectional view of a field-effect transistor according to a fifth embodiment of the present invention.

FIG. 14 is a cross-sectional view of a field-effect transistor according to a fifth embodiment of the present invention.

As shown in FIG. 14, in the field-effect transistor of this embodiment, for example, a Si substrate is used as a conductive substrate.

Specifically, the field-effect transistor of this embodiment includes a Si substrate 1401, and an AlN buffer layer 1402 having a thickness of 100 nm, an undoped GaN layer 1403 having a thickness of 1 µm, an undoped AlGaN layer 1404 having a thickness of 25 nm, and a heavily doped p-type GaN layer 1406 having a thickness of 5 nm formed in this order on an upper surface of the Si substrate 1401.

The field-effect transistor of this embodiment further includes a gate electrode 1411 formed of Pd which forms an Ohmic contact with the heavily doped p-type GaN layer 1406, a source electrode 1409 and a drain electrode 1410 each of which is formed of a Ti layer and an Al layer and forms an Ohmic contact with the undoped AlGaN layer 1404, a back surface electrode 1415 forming an Ohmic contact with a back surface of the Si substrate 1401, and a SiN film 1408. In the field-effect transistor of this embodiment, an isolation region 1407 surrounding a device formation region is formed. Furthermore, in the field-effect transistor of this embodiment, a via hole 1412 is formed in a device formation region so as to reach the Si substrate 1407 from the SiN film 1408, a via hole metal 1413 is formed of Al or the like at a bottom of the via hole 1412 to form an Ohmic contact with the Si substrate 1401, and an interconnect metal 1414 for connecting the source electrode 1409 and the via hole metal 1413. As a material for the back surface electrode 1415, a stacked layer of titanium silicide (TiSi) and titanium nitride (TiN) is used. Note that when as a conductive substrate, silicon carbide (SiC) is used, instead of the Si substrate, a lamination body of Ti/Al can be used as a back surface electrode.

In the field-effect transistor of this embodiment, the source electrode 1409 is electrically connected to the Si substrate 1401 through the interconnect metal 1414 and the via hole metal 1413. Accordingly, by setting the back surface electrode 1415 to be a ground potential, the source electrode 1409 can be grounded via the via hole metal 1413 and the back surface electrode 1415. Thus, a source interconnect on a device surface can be eliminated, so that a device area can be reduced. Moreover, when a high drain voltage is applied, an electric line of force extends not only toward the gate electrode but also toward the Si substrate, so that electric field concentration between the gate electrode and the drain electrode can be eased and a breakdown voltage can be increased. Therefore, the device structure of this embodiment is effective for operating as a power transistor.

A field-effect transistor according to the present invention is useful as a power transistor for use in a power supply circuit for a consumer-electronics product such as a TV set.

What is claimed is:

1. A field-effect transistor comprising:
   a substrate;
   a first nitride semiconductor layer formed above the substrate;
   a second nitride semiconductor layer being formed on the first nitride semiconductor layer and having a larger band gap energy than that of the first nitride semiconductor layer;
   a third nitride semiconductor layer formed on the second nitride semiconductor layer and having a doped layer containing a p-type impurity and a heavily-doped layer containing a p-type impurity at a higher concentration than the doped layer;
   a gate electrode formed on or above and in contact with the heavily-doped layer of the third nitride semiconductor layer;
   source and drain electrodes formed on or above the second nitride semiconductor layer so as to be located on both sides of the gate electrode, respectively; and
   a passivation film for covering at least a side surface of the third nitride semiconductor layer.

2. The field-effect transistor of claim 1, wherein the passivation film is a silicon nitride film.

3. The field-effect transistor of claim 1, wherein a thickness of the doped layer is larger than a thickness of the heavily doped layer.

* * * * *

UNITED STATES PATENT AND TRADEMARK OFFICE
CERTIFICATE OF CORRECTION

PATENT NO. : 8,264,002 B2
APPLICATION NO. : 12/880704
DATED : September 11, 2012
INVENTOR(S) : Masahiro Hikita et al.

It is certified that error appears in the above-identified patent and that said Letters Patent is hereby corrected as shown below:

Title Page in (56) References Cited Insert:

--FOREIGN PATENT DOCUMENTS

JP   06-232165 08/1994
JP   03-191532 08/1991
JP   2003-059946 02/2003
JP   2003-257999 09/2003--

Signed and Sealed this
Twenty-sixth Day of February, 2013

Teresa Stanek Rea
*Acting Director of the United States Patent and Trademark Office*